(12) United States Patent
Lim et al.

(10) Patent No.: US 10,535,380 B1
(45) Date of Patent: Jan. 14, 2020

(54) SEMICONDUCTOR DEVICES AND SEMICONDUCTOR SYSTEMS INCLUDING THE SEMICONDUCTOR DEVICES

(71) Applicant: SK hynix Inc., Icheon-si, Gyeonggi-do (KR)

(72) Inventors: Yu Ri Lim, Daejeon (KR); Hyun Seung Kim, Icheon-si (KR); Sang Sic Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/215,365

(22) Filed: Dec. 10, 2018

(30) Foreign Application Priority Data

Sep. 3, 2018 (KR) .................. 10-2018-0104789

(51) Int. Cl.
| | |
|---|---|
| *G11C 7/00* | (2006.01) |
| *G11C 7/10* | (2006.01) |
| *H03K 3/037* | (2006.01) |
| *G11C 7/22* | (2006.01) |
| *H03K 19/20* | (2006.01) |

(52) U.S. Cl.
CPC .......... *G11C 7/1009* (2013.01); *G11C 7/1048* (2013.01); *G11C 7/1087* (2013.01); *G11C 7/222* (2013.01); *H03K 3/037* (2013.01); *H03K 19/20* (2013.01)

(58) Field of Classification Search
CPC ....... G11C 7/1051; G11C 7/1078; G11C 7/22; G11C 7/106; G11C 7/1057
USPC ..................................................... 365/189.05
See application file for complete search history.

(56) References Cited

U.S. PATENT DOCUMENTS

| | | | | |
|---|---|---|---|---|
| 5,777,942 | A * | 7/1998 | Dosaka | G11C 11/005 365/230.03 |
| 8,201,071 | B2 | 6/2012 | Hein et al. | |
| 2018/0196711 | A1 * | 7/2018 | Noro | G06F 11/1012 |

FOREIGN PATENT DOCUMENTS

KR    1020150029112 A    3/2015

* cited by examiner

*Primary Examiner* — Son T Dinh
(74) *Attorney, Agent, or Firm* — William Park & Associates Ltd.

(57) ABSTRACT

A semiconductor device includes a data detection circuit configured to detect a number of bits having a predetermined logic level among bits included in data to generate a detection signal. The semiconductor device also includes a selection/transmission circuit configured to output the detection signal or a control data signal as a pre-masking signal based on a selection/transmission signal. The semiconductor device further includes a masking signal generation circuit configured to latch the pre-masking signal based on a pipe input control signal and configured to output the latched signal of the pre-masking signal as a masking signal for controlling a data masking operation based on a pipe output control signal.

20 Claims, 8 Drawing Sheets

FIG.4

| DMI | ZeroF | SUMF | DET |
|-----|-------|------|-----|
| L | L | H | H |
| L | H | L | L |
| H | L | L | L |
| H | H | L | L |

US 10,535,380 B1

SEMICONDUCTOR DEVICES AND SEMICONDUCTOR SYSTEMS INCLUDING THE SEMICONDUCTOR DEVICES

CROSS-REFERENCE TO RELATED APPLICATION

The present application claims priority under 35 U.S.C 119(a) to Korean Application No. 10-2018-0104789, filed on Sep. 3, 2018, which is incorporated herein by reference in its entirety.

BACKGROUND

1. Technical Field

Embodiments of the present disclosure relate to semiconductor devices performing a data masking operation and a data bus inversion operation and semiconductor systems including such semiconductor devices.

2. Related Art

In a semiconductor system including a controller and a semiconductor device, a read operation or a write operation may be performed by transmission of data between the controller and the semiconductor device. During the read operation, data stored in the semiconductor device may be transmitted to the controller. During the write operation, data outputted from the controller may be transmitted to the semiconductor device and may be stored in a storage unit of the semiconductor device. A data masking operation may be used to store only desired bits among bits of the data outputted from the controller to the storage unit of the semiconductor device. That is, if the data masking operation is performed, the semiconductor system stores only desired bits among the data outputted from the controller in the semiconductor device. So that the data masking operation is performed in the semiconductor system, a data masking signal including information on data to be masked should be transmitted together with the data from the controller to the semiconductor device.

If the number of data bits whose phases are changed when the data are transmitted in the semiconductor system increases, a simultaneous switching noise (SSN) phenomenon and an inter-symbol interface (ISI) phenomenon may occur more frequently. Recently, a data bus inversion (DBI) scheme has been used to suppress the SSN phenomenon and the ISI phenomenon.

SUMMARY

According to an embodiment, a semiconductor device includes a data detection circuit configured to detect a number of bits having a predetermined logic level among bits included in data to generate a detection signal. The semiconductor device also includes a selection/transmission circuit configured to output the detection signal or a control data signal as a pre-masking signal based on a selection/transmission signal. The semiconductor device further includes a masking signal generation circuit configured to latch the pre-masking signal based on a pipe input control signal and configured to output the latched signal of the pre-masking signal as a masking signal for controlling a data masking operation based on a pipe output control signal.

According to another embodiment, a semiconductor device includes a data detection circuit and a selection/transmission circuit. The data detection circuit is configured to divide bits included in data into at least two groups, configured to generate a detection signal, wherein the detection signal is enabled when a number of bits having a predetermined logic level among the bits included in the data is zero or one, and wherein the detection signal is enabled when a number of the groups including at least one bit having the predetermined logic level is zero or one. The selection/transmission circuit is configured to output the detection signal or a control data signal as a pre-masking signal based on a selection/transmission signal.

According to an additional embodiment, a semiconductor system includes a first semiconductor device and a second semiconductor device. The first semiconductor device is configured to output a command, data, and a control data signal. The second semiconductor device is configured to detect a number of bits having a predetermined logic level among bits included in the data to generate a detection signal when the second semiconductor device performs a write operation based on the command. In addition, the second semiconductor device is configured to control a data masking operation and a data bus inversion operation based on the control data signal and the detection signal.

BRIEF DESCRIPTION OF THE DRAWINGS

FIG. 4 shows a table illustrating an operation of the data detection circuit shown in FIG. 3.

DETAILED DESCRIPTION OF THE EMBODIMENTS

Various embodiments of the present disclosure are described herein with reference to the accompanying drawings. However, the described embodiments are for illustrative purposes only and are not intended to limit the scope of the present disclosure.

Figure 1:
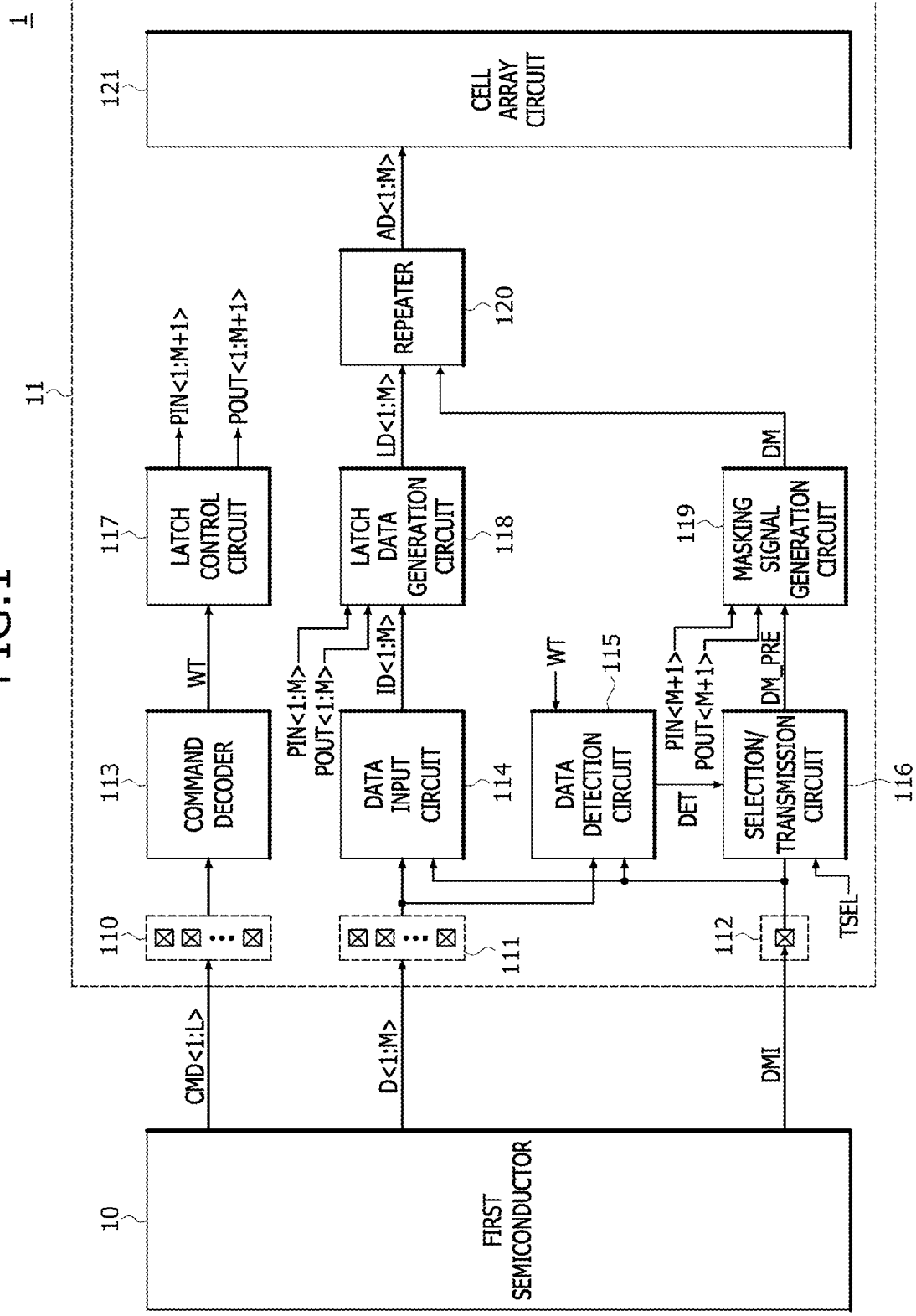
FIG. 1 shows a block diagram illustrating a semiconductor system, according to an embodiment.

As illustrated in FIG. 1, a semiconductor system 1 according to an embodiment may include a first semiconductor device 10 and a second semiconductor device 11. The first semiconductor device 10 may apply a command CMD<1:L>, data D<1:M>, and a control data signal DMI to the second semiconductor device 11. The first semiconductor device 10 may be realized using a memory controller (1002 of FIG. 8). The second semiconductor device 11 may include command pads 110, data pads 111, a control data pad 112, a command decoder 113, a data input circuit 114, a data detection circuit 115, a selection/transmission circuit 116, a latch control circuit 117, a latch data generation circuit 118, a masking signal generation circuit 119, a repeater 120, and a cell array circuit 121.

The second semiconductor device 11 may receive the command CMD<1:L> through the command pads 110. The second semiconductor device 11 may receive the data D<1:M> through the data pads 111. The second semiconductor device 11 may receive the control data signal DMI through the control data pad 112.

The command decoder 113 may decode the command CMD<1:L> to generate a write signal WT. The write signal WT may be generated to perform a write operation. A logic level combination of the command CMD<1:L> for generating the write signal WT may be set differently for different embodiments. The number "L" of bits included in the command CMD<1:L> may be set differently for different embodiments.

The data input circuit 114 may receive the data D<1:M> based on the control data signal DMI. The data input circuit 114 may buffer or inversely buffer the data D<1:M>, according to a logic level of the control data signal DMI, to generate internal data ID<1:M>. The data input circuit 114 may inversely buffer the data D<1:M> to generate the internal data ID<1:M> if the control data signal DMI has a first logic level. The data input circuit 114 may buffer the data D<1:M> to generate the internal data ID<1:M> if the control data signal DMI has a second logic level. In the present embodiment, the first logic level of the control data signal DMI may be set as a logic "high" level, and the second logic level of the control data signal DMI may be set as a logic "low" level. A configuration and an operation of the data input circuit 114 is described more fully below with reference to FIG. 2.

The data detection circuit 115 may detect logic levels of the data D<1:M> based on the write signal WT and the control data signal DMI to generate a detection signal DET. The write signal WT may be generated to execute the write operation. The data detection circuit 115 may generate the detection signal DET which is enabled to perform a data masking operation if the number of bits having a predetermined logic level among the bits included in the data D<1:M> is zero or one while the write operation is performed and the control data signal DMI has the second logic level. In the present embodiment, the predetermined logic level for the bits of the data D<1:M> may be set as a logic "low(0)" level. A configuration and an operation of the data detection circuit 115 is described more fully below with reference to FIGS. 3 and 4.

The word "predetermined" as used herein with respect to a parameter, such as a predetermined logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The selection/transmission circuit 116 may generate a pre-masking signal DM_PRE from the detection signal DET or the control data signal DMI based on a selection/transmission signal TSEL. The selection/transmission signal TSEL may be stored in a mode register by a mode register set (MRS) operation in advance. The selection/transmission circuit 116 may buffer the detection signal DET to output the buffered signal of the detection signal DET as the pre-masking signal DM_PRE if the selection/transmission signal TSEL has a first logic level. The selection/transmission circuit 116 may buffer the control data signal DMI to output the buffered signal of the control data signal DMI as the pre-masking signal DM_PRE if the selection/transmission signal TSEL has a second logic level. In the present embodiment, the first logic level of the selection/transmission signal TSEL may be set as a logic "high" level, and the second logic level of the selection/transmission signal TSEL may be set as a logic "low" level. A configuration and an operation of the selection/transmission circuit 116 is described more fully below with reference to FIG. 5.

The latch control circuit 117 may generate a pipe input control signal PIN<1:M+1> and a pipe output control signal POUT<1:M+1> based on the write signal WT. The latch control circuit 117 may sequentially generate the pipe input control signal PIN<1:M+1> and the pipe output control signal POUT<1:M+1> if the write signal WT for performing the write operation is generated. The latch control circuit 117 may generate the pipe input control signal PIN<1:M> at a point in time when a first delay period elapses from a point in time when the write signal WT is generated. The latch control circuit 117 may generate the pipe output control signal POUT<1:M> at a point in time when a second delay period elapses from a point in time when the pipe input control signal PIN<1:M> is generated. The first and second delay periods may be set differently for different embodiments.

The latch data generation circuit 118 may generate latch data LD<1:M> from the internal data ID<1:M> based on the pipe input control signal PIN<1:M> and the pipe output control signal POUT<1:M>. The latch data generation circuit 118 may latch the internal data ID<1:M> if the pipe input control signal PIN<1:M> is generated. The latch data generation circuit 118 may output the latched data of the internal data ID<1:M> as the latch data LD<1:M> if the pipe output control signal POUT<1:M> is generated. A configuration and an operation of the latch data generation circuit 118 is described more fully below with reference to FIG. 6.

The masking signal generation circuit 119 may generate a masking signal DM from the pre-masking signal DM_PRE based on the pipe input control signal PIN<M+1> and the pipe output control signal POUT<M+1>. The masking signal generation circuit 119 may latch the pre-masking signal DM_PRE if the pipe input control signal PIN<M+1> is generated. The masking signal generation circuit 119 may output the latched signal of the pre-masking signal DM_PRE as the masking signal DM if the pipe output control signal POUT<M+1> is generated. A configuration and an operation of the masking signal generation circuit 119 is described more fully below with reference to FIG. 7.

The repeater 120 may amplify the latch data LD<1:M> based on the masking signal DM to generate amplified data AD<1:M>, which are stored in the cell array circuit 121. The repeater 120 may amplify the latch data LD<1:M> to generate the amplified data AD<1:M> if the masking signal DM is disabled. The repeater 120 may perform the data masking operation that interrupts generating the amplified data AD<1:M> from the latch data LD<1:M> if the masking signal DM is enabled. A logic level of the enabled masking signal may be set differently for different embodiments. The repeater 120 may perform the data masking operation for some bits included in the latch data LD<1:M> in response to the masking signal DM according to embodiment. The masking signal DM may include information on bits which are interrupted among the bits included in the amplified data AD<1:M>.

Figure 2:
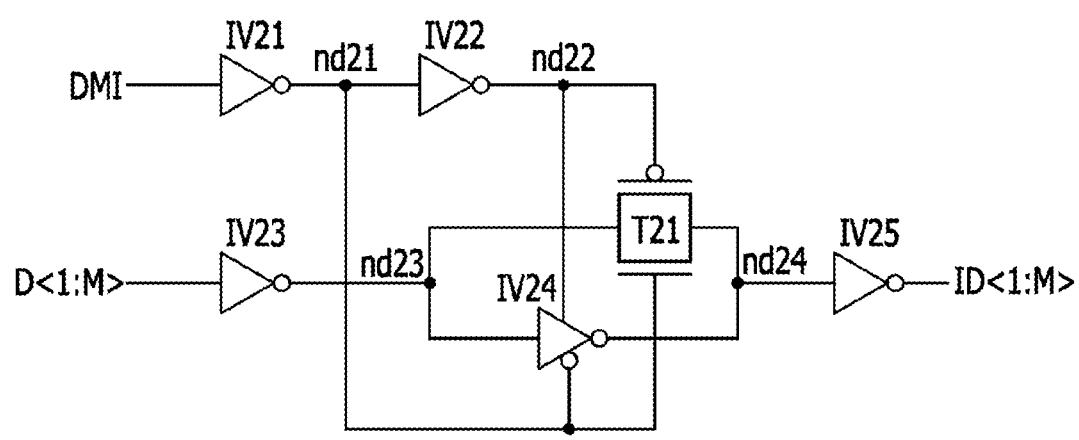
FIG. 2 shows a circuit diagram illustrating a data input circuit included in the semiconductor system of FIG. 1.

Referring to FIG. 2, the data input circuit 114 may include inverters IV21~IV25 and a transfer gate T21. As used herein, the tilde "~" indicates a range of components. For example, "IV21~IV25" indicates the inverters IV21, IV22, IV23, IV24, and IV25 shown in FIG. 2. The inverter IV21 may inversely buffer the control data signal DMI to output the inversely buffered data of the control data signal DMI to a node nd21. The inverter IV22 may inversely buffer a signal of the node nd21 to output the inversely buffered signal of the node nd21 to a node nd22. The inverter IV23 may inversely buffer the data D<1:M> to output the inversely buffered data of the data D<1:M> to a node nd23. The transfer gate T21 may be turned on based on signals of the nodes nd21 and nd22. The transfer gate T21 may be turned on to transmit the signal of the node nd23 to a node nd24 if the control data signal DMI has a logic "low" level. The inverter IV24 may operate based on the signals of the nodes nd21 and nd22. The inverter IV24 may inversely buffer the signal of the node nd23 to output the inversely buffered signal of the node nd23 to the node nd24 if the control data signal DMI has a logic "high" level. The inverter IV25 may inversely buffer a signal of the node nd24 to output the inversely buffered signal of the signal of the node nd24 as the internal data ID<1:M>.

The data input circuit 114 may inversely buffer the data D<1: M> to output the inversely buffered data of the data D<1: M> as the internal data ID<1:M> if the control data signal DMI has a logic "high" level. The data input circuit 114 may buffer the data D<1:M> to output the buffered data of the data D<1:M> as the internal data ID<1:M> if the control data signal DMI has a logic "low" level.

Figure 3:
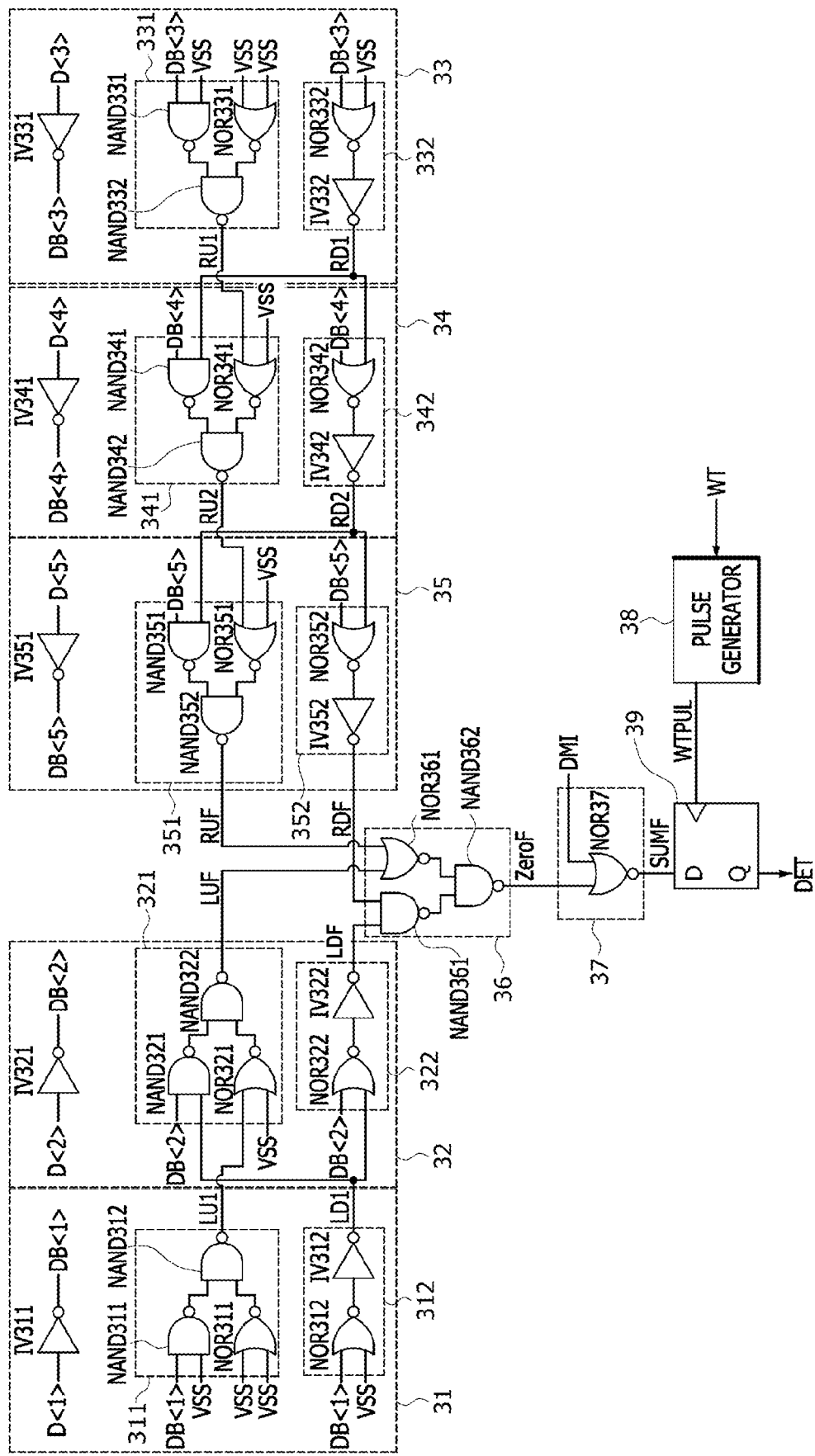
FIG. 3 shows a circuit diagram illustrating a data detection circuit included in the semiconductor system of FIG. 1.

Referring to FIG. 3, the data detection circuit 115 may include a first discrimination circuit 31, a second discrimination circuit 32, a third discrimination circuit 33, a fourth discrimination circuit 34, a fifth discrimination circuit 35, a zero flag generation circuit 36, a synthesis flag generation circuit 37, a pulse generator 38, and a detection signal generation circuit 39. FIG. 3 illustrates an example for which the number "M" of bits included in the data D<1:M> is five.

The first discrimination circuit 31 may include an inverter IV311, a first left up-discriminator 311, and a first left down-discriminator 312. The inverter IV311 may inversely buffer a first bit D<1> of the data D<1:5> to generate a first bit DB<1> of inverted data. The first left up-discriminator 311 may include NAND gates NAND311 and NAND312 and a NOR gate NOR311. The NAND gate NAND311 may perform a logical NAND operation of the first bit DB<1> of the inverted data and a ground voltage VSS. The NAND gate NAND311 may output a signal having a logic "high" level regardless of a logic level of the first bit DB<1> of the inverted data. The NOR gate NOR311 may perform a logical NOR operation of two ground voltages VSS. The NOR gate NOR311 may output a signal having a logic "high" level. The NAND gate NAND312 may perform a logical NAND operation of an output signal of the NAND gate NAND311 and an output signal of the NOR gate NOR311 to generate a first left up-signal LU1. The first left up-discriminator 311 may generate the first left up-signal LU1, which is disabled to have a logic "low" level regardless of a logic level of the first bit DB<1> of the inverted data. The first left down-discriminator 312 may include a NOR gate NOR312 and an inverter IV312. The NOR gate NOR312 may perform a logical NOR operation of the first bit DB<1> of the inverted data and the ground voltage VSS. The inverter IV312 may inversely buffer an output signal of the NOR gate NOR312 to output the inversely buffered signal of the output signal of the NOR gate NOR312 as a first left down-signal LD1. The first left down-discriminator 312 may generate the first left down-signal LD1 which is enabled to have a logic "high" level if the first bit DB<1> of the inverted data has a logic "high" level.

The first discrimination circuit 31 may generate the first left up-signal LU1 which is disabled to have a logic "low" level. The first discrimination circuit 31 may generate the first left down-signal LD1 which is enabled to have a logic "high" level if the first bit DB<1> of the inverted data has a logic "high" level (i.e., the first bit D<1> of the data D<1:5> has a logic "low" level).

The second discrimination circuit 32 may include an inverter IV321, a second left up-discriminator 321, and a second left down-discriminator 322. The inverter IV321 may inversely buffer a second bit D<2> of the data D<1:5> to generate a second bit DB<2> of the inverted data. The second left up-discriminator 321 may include NAND gates NAND321 and NAND322 and a NOR gate NOR321. The NAND gate NAND321 may perform a logical NAND operation of the second bit DB<2> of the inverted data and the first left down-signal LD1. The NOR gate NOR321 may perform a logical NOR operation of the first left up-signal LU1 and the ground voltage VSS. The NAND gate NAND322 may perform a logical NAND operation of an output signal of the NAND gate NAND321 and an output signal of the NOR gate NOR321 to generate a left up-flag LUF. The second left up-discriminator 321 may generate the left up-flag LUF which is enabled to have a logic "high" level if the first left down-signal LD1 is enabled to have a logic "high" level and the second bit DB<2> of the inverted data has a logic "high" level. The second left down-discriminator 322 may include a NOR gate NOR322 and an inverter IV322. The NOR gate NOR322 may perform a logical NOR operation of the second bit DB<2> of the inverted data and the first left down-signal LD1. The inverter IV322 may inversely buffer an output signal of the NOR gate NOR322 to output the inversely buffered signal of the output signal of the NOR gate NOR322 as a left down-flag LDF. The second left down-discriminator 322 may generate the left down-flag LDF which is enabled to have a logic "high" level if the first left down-signal LD1 is enabled to have a logic "high" level. The second left down-discriminator 322 may generate the left down-flag LDF which is enabled to have a logic "high" level if the second bit DB<2> of the inverted data has a logic "high" level.

The second discrimination circuit 32 may generate the left up-flag LUF which is enabled to have a logic "high" level if the first left down-signal LD1 is enabled to have a logic "high" level and the second bit DB<2> of the inverted data has a logic "high" level. The second discrimination circuit 32 may generate the left up-flag LUF which is enabled to have a logic "high" level if both of the first and second bits D<1:2> of the data D<1:5> have a logic "low(0)" level. The second discrimination circuit 32 may generate the left down-flag LDF which is enabled to have a logic "high" level if the first left down-signal LD1 is enabled to have a logic "high" level. The second discrimination circuit 32 may generate the left down-flag LDF which is enabled to have a logic "high" level if the second bit DB<2> of the inverted data has a logic "high" level (i.e., the second bit D<2> of the data D<1:5> has a logic "low(0)" level). The second discrimination circuit 32 may generate the left down-flag LDF which is enabled to have a logic "high" level if the first bit D<1> or the second bit D<2> of the data D<1:5> has a logic "low(0)" level.

The third discrimination circuit 33 may include an inverter IV331, a first right up-discriminator 331, and a first right down-discriminator 332. The inverter IV331 may inversely buffer a third bit D<3> of the data D<1:5> to generate a third bit DB<3> of the inverted data. The first right up-discriminator 331 may include NAND gates NAND331 and NAND332 and a NOR gate NOR331. The NAND gate NAND331 may perform a logical NAND operation of the third bit DB<3> of the inverted data and the ground voltage VSS. The NAND gate NAND331 may output a signal having a logic "high" level regardless of a logic level of the third bit DB<3> of the inverted data. The NOR gate NOR331 may perform a logical NOR operation of the two ground voltages VSS. The NOR gate NOR331 may output a signal having a logic "high" level. The NAND gate NAND332 may perform a logical NAND operation of an output signal of the NAND gate NAND331 and an output signal of the NOR gate NOR331 to generate a first right up-signal RU1. The first right up-discriminator 331 may generate the first right up-signal RU1 which is disabled to have a logic "low" level regardless of a logic level of the third bit DB<3> of the inverted data. The first right down-discriminator 332 may include a NOR gate NOR332 and an inverter IV332. The NOR gate NOR332 may perform a logical NOR operation of the third bit DB<3> of the inverted data and the ground voltage VSS. The inverter IV332 may inversely buffer an output signal of the NOR gate NOR332 to output the inversely buffered signal of the output signal of the NOR gate NOR332 as a first right down-signal RD1. The first right down-discriminator 332 may generate the first right down-signal RD1 which is enabled to have a logic "high" level if the third bit DB<3> of the inverted data has a logic "high" level.

The third discrimination circuit 33 may generate the first right up-signal RU1, which is disabled to have a logic "low" level. The third discrimination circuit 33 may generate the first right down-signal RD1 which is enabled to have a logic "high" level if the third bit DB<3> of the inverted data has a logic "high" level (i.e., the third bit D<3> of the data D<1:5> has a logic "low" level).

The fourth discrimination circuit 34 may include an inverter IV341, a second right up-discriminator 341 and a second right down-discriminator 342. The inverter IV341 may inversely buffer a fourth bit D<4> of the data D<1:5> to generate a fourth bit DB<2> of the inverted data. The second right up-discriminator 341 may include NAND gates NAND341 and NAND342 and a NOR gate NOR341. The NAND gate NAND341 may perform a logical NAND operation of the fourth bit DB<4> of the inverted data and the first right down-signal RD1. The NOR gate NOR341 may perform a logical NOR operation of the first right up-signal RU1 and the ground voltage VSS. The NAND gate NAND342 may perform a logical NAND operation of an output signal of the NAND gate NAND341 and an output signal of the NOR gate NOR341 to generate a second right up-signal RU2. The second right up-discriminator 341 may generate the second right up-signal RU2 which is enabled to have a logic "high" level if the first right down-signal RD1 is enabled to have a logic "high" level and the fourth bit DB<4> of the inverted data has a logic "high" level. The second right down-discriminator 342 may include a NOR gate NOR342 and an inverter IV342. The NOR gate NOR342 may perform a logical NOR operation of the fourth bit DB<4> of the inverted data and the first right down-signal RD1. The inverter IV342 may inversely buffer an output signal of the NOR gate NOR342 to output the inversely buffered signal of the output signal of the NOR gate NOR342 as a second right down-signal RD2. The second right down-discriminator 342 may generate the second right down-signal RD2 which is enabled to have a logic "high" level if the first right down-signal RD1 is enabled to have a logic "high" level. The second right down-discriminator 342 may generate the second right down-signal RD2 which is enabled to have a logic "high" level if the fourth bit DB<4> of the inverted data has a logic "high" level.

The fourth discrimination circuit 34 may generate the second right up-signal RU2 which is enabled to have a logic "high" level if the first right down-signal RD1 is enabled to have a logic "high" level and the fourth bit DB<4> of the inverted data has a logic "high" level. The fourth discrimination circuit 34 may generate the second right up-signal RU2 which is enabled to have a logic "high" level if both of the third and fourth bits D<3:4> of the data D<1:5> have a logic "low(0)" level. The fourth discrimination circuit 34 may generate the second right down-signal RD2 which is enabled to have a logic "high" level if the first right down-signal RD1 is enabled to have a logic "high" level. The fourth discrimination circuit 34 may generate the second right down-signal RD2 which is enabled to have a logic "high" level if the fourth bit DB<4> of the inverted data has a logic "high" level (i.e., the fourth bit D<4> of the data D<1:5> has a logic "low(0)" level). The fourth discrimination circuit 34 may generate the second right down-signal RD2 which is enabled to have a logic "high" level if the third bit D<3> or the fourth bit D<4> of the data D<1:5> has a logic "low(0)" level.

The fifth discrimination circuit 35 may include an inverter IV351, a third right up-discriminator 351, and a third right down-discriminator 352. The inverter IV351 may inversely buffer a fifth bit D<5> of the data D<1:5> to generate a fifth bit DB<5> of the inverted data. The third right up-discriminator 351 may include NAND gates NAND351 and NAND352 and a NOR gate NOR351. The NAND gate NAND351 may perform a logical NAND operation of the fifth bit DB<5> of the inverted data and the second right down-signal RD2. The NOR gate NOR351 may perform a logical NOR operation of the second right up-signal RU2 and the ground voltage VSS. The NAND gate NAND352 may perform a logical NAND operation of an output signal of the NAND gate NAND351 and an output signal of the NOR gate NOR351 to generate a right up-flag RUF. The third right up-discriminator 351 may generate the right up-flag RUF which is enabled to have a logic "high" level if the second right down-signal RD2 is enabled to have a logic "high" level and the fifth bit DB<5> of the inverted data has a logic "high" level. The third right up-discriminator 351 may generate the right up-flag RUF which is enabled to have a logic "high" level if the second right up-signal RU2 is enabled to have a logic "high" level. The third right down-discriminator 352 may include a NOR gate NOR352 and an inverter IV352. The NOR gate NOR352 may perform a logical NOR operation of the fifth bit DB<5> of the inverted data and the second right down-signal RD2. The inverter IV352 may inversely buffer an output signal of the NOR gate NOR352 to output the inversely buffered signal of the output signal of the NOR gate NOR352 as a right down-flag RDF. The third right down-discriminator 352 may generate the right down-flag RDF which is enabled to have a logic "high" level if the second right down-signal RD2 is enabled to have a logic "high" level. The third right down-discriminator 352 may generate the right down-flag RDF which is enabled to have a logic "high" level if the fifth bit DB<5> of the inverted data has a logic "high" level.

The fifth discrimination circuit 35 may generate the right up-flag RUF which is enabled to have a logic "high" level if the second right down-signal RD2 is enabled to have a logic "high" level and the fifth bit DB<5> of the inverted data has a logic "high" level. The fifth discrimination circuit 35 may generate the right up-flag RUF which is enabled to have a logic "high" level if the second right up-signal RU2 is enabled to have a logic "high" level. The fifth discrimination circuit 35 may generate the right up-flag RUF which is enabled to have a logic "high" level if at least two of the third to fifth bits D<3:5> of the data D<1:5> have a logic "low(0)" level. The fifth discrimination circuit 35 may generate the right down-flag RDF which is enabled to have a logic "high" level if the second right down-signal RD2 is enabled to have a logic "high" level. The fifth discrimination circuit 35 may generate the right down-flag RDF which is enabled to have a logic "high" level if the fifth bit DB<5> of the inverted data has a logic "high" level (i.e., the fifth bit D<5> of the data D<1:5> has a logic "low(0)" level). The fifth discrimination circuit 35 may generate the right down-flag RDF which is enabled to have a logic "high" level if at least one of the third to fifth bits D<3:5> of the data D<1:5> have a logic "low(0)" level.

The zero flag generation circuit 36 may include NAND gates NAND361 and NAND362 and a NOR gate NOR361. The NAND gate NAND361 may perform a logical NAND operation of the left down-flag LDF and the right down-flag RDF. The NOR gate NOR361 may perform a logical NOR operation of the left up-flag LUF and the right up-flag RUF. The NAND gate NAND362 may perform a logical NAND operation of an output signal of the NAND gate NAND361 and an output signal of the NOR gate NOR361. The zero flag generation circuit 36 may generate a zero flag ZeroF which is enabled to have a logic "high" level if both of the left down-flag LDF and the right down-flag RDF are enabled to have a logic "high" level. If at least one of the first and second bits D<1:2> of the data D<1:5> has a logic "low(0)" level and at least one of the third to fifth bits D<3:5> of the data D<1:5> has a logic "low(0)" level, at least two of the first to fifth bits D<1:5> may be discriminated as having a logic "low" level. In such a case, the zero flag generation circuit 36 may generate the zero flag ZeroF which is enabled to have a logic "high" level. The zero flag generation circuit 36 may generate the zero flag ZeroF which is enabled to have a logic "high" level if the left up-flag LUF or the right up-flag RUF is enabled to have a logic "high" level. The zero flag generation circuit 36 may generate the zero flag ZeroF which is enabled to have a logic "high" level if both of the first and second bits D<1:2> of the data D<1:5> have a logic "low" level. The zero flag generation circuit 36 may generate the zero flag ZeroF which is enabled to have a logic "high" level if at least two of the third to fifth bits D<3:5> of the data D<1:5> have a logic "low" level.

The synthesis flag generation circuit 37 may include a NOR gate NOR37. The NOR gate NOR37 may perform a logical NOR operation of the zero flag ZeroF and the control data signal DMI to generate a synthesis flag SUMF. The synthesis flag generation circuit 37 may generate the synthesis flag SUMF from the zero flag ZeroF based on the control data signal DMI. The synthesis flag generation circuit 37 may inversely buffer the zero flag ZeroF to output the inversely buffered signal of the zero flag ZeroF as the synthesis flag SUMF if the control data signal DMI has a logic "low" level. The synthesis flag generation circuit 37 may output the synthesis flag SUMF having a logic "high" level if both of the control data signal DMI and the zero flag ZeroF have a logic "low" level. The synthesis flag generation circuit 37 may output the synthesis flag SUMF having a logic "low" level if the control data signal DMI has a logic "low" level and the zero flag ZeroF has a logic "high" level. The synthesis flag generation circuit 37 may output the synthesis flag SUMF having a logic "low" level if the control data signal DMI has a logic "high" level.

The pulse generator 38 may generate a write pulse WTPUL based on the write signal WT. The pulse generator 38 may create the write pulse WTPUL if the write signal WT for performing the write operation is generated. A pulse with of the write pulse WTPUL may be set differently for different embodiments.

The detection signal generation circuit 39 may latch the synthesis flag SUMF to output the latched signal of the synthesis flag SUMF as the detection signal DET if the write pulse WTPUL is created. The detection signal generation circuit 39 may be realized using a D-flipflop.

The data detection circuit 115 may generate the detection signal DET which is enabled to have a logic "high" level if the write signal WT is created to perform the write operation and one or none of the bits included in the data D<1:M> has a predetermined logic level while the control data signal DMI has a logic "low" level. In the present embodiment, the predetermined logic level of the bits included in the data D<1:M> may be set to be a logic "low(0)" level.

In the present embodiment, the data detection circuit 115 may divide the bits of the data D<1:5> into two groups. That is, the first and second bits D<1:2> of the data D<1:5> may be classified to belong to a first group, and the third to fifth bits D<3:5> of the data D<1:5> may be classified to belong to a second group. Although FIG. 3 illustrates an example in which the data detection circuit 115 detects the number of bits having a predetermined logic level among the bits included in the first group D<1:2> of the data D<1:5> using the first and second discrimination circuits 31 and 32 located at a left side and also detects the number of bits having the predetermined logic level among the bits included in the second group D<3:5> of the data D<1:5> using the third to fifth discrimination circuits 33, 34 and 35 located at a right side, the number of the bits included in the first group of the data and the number of the bits included in the second group of the data may be set differently for different embodiments.

Figure 4:
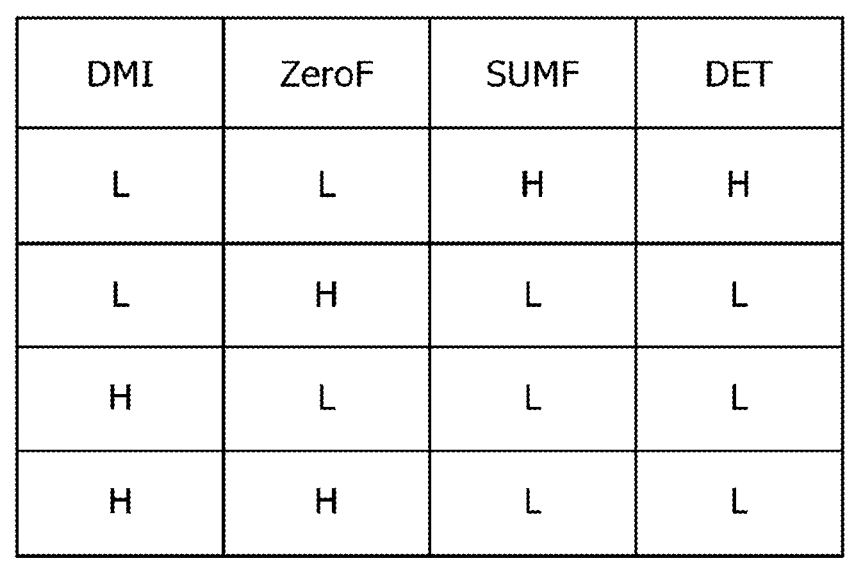

Referring to FIG. 4, logic levels of the synthesis flag SUMF and the detection signal DET generated according to logic levels of the control data signal DMI and the zero flag ZeroF are illustrated. If the control data signal DMI has a logic "low" level (as indicated by the upper-case letter "L"), the synthesis flag SUMF and the detection signal DET may be generated to have an inverted logic level of the zero flag ZeroF. Both of the synthesis flag SUMF and the detection signal DET may be set to have a logic "high" level (as indicated by the upper-case letter "H") if the control data signal DMI has a logic "low" level and the zero flag ZeroF has a logic "low" level. Both of the synthesis flag SUMF and the detection signal DET may be set to have a logic "low" level if the control data signal DMI has a logic "low" level and the zero flag ZeroF has a logic "high" level. If the control data signal DMI has a logic "high" level, both of the synthesis flag SUMF and the detection signal DET may be set to have a logic "low" level regardless of the zero flag ZeroF.

Figure 5:
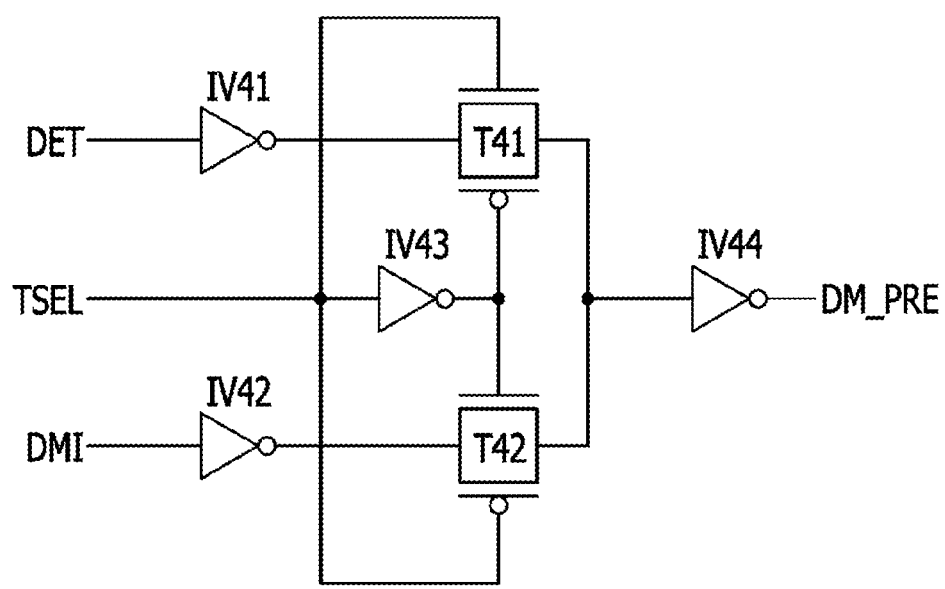
FIG. 5 shows a circuit diagram illustrating a selection/transmission circuit included in the semiconductor system of FIG. 1.

Referring to FIG. 5, the selection/transmission circuit 116 may include inverters IV41~IV44 and transfer gates T41 and T42. The inverter IV41 may inversely buffer the detection signal DET to output the inversely buffered signal of the detection signal DET. The inverter IV42 may inversely buffer the control data signal DMI to output the inversely buffered signal of the control data signal DMI. The inverter IV43 may inversely buffer the selection/transmission signal TSEL to output the inversely buffered signal of the selection/transmission signal TSEL. The transfer gate T41 may be turned on if the selection/transmission signal TSEL has a logic "high" level. The inverter IV44 may inversely buffer an output signal of the transfer gate T41 or the transfer gate T42 to output the inversely buffered signal as the pre-masking signal DM_PRE. The selection/transmission circuit 116 may buffer the detection signal DET to output the buffered signal of the detection signal DET as the pre-masking signal DM_PRE if the selection/transmission signal TSEL has a logic "high" level. The selection/transmission circuit 116 may buffer the control data signal DMI to output the buffered signal of the control data signal DMI as the pre-masking signal DM_PRE if the selection/transmission signal TSEL has a logic "low" level.

Figure 6:
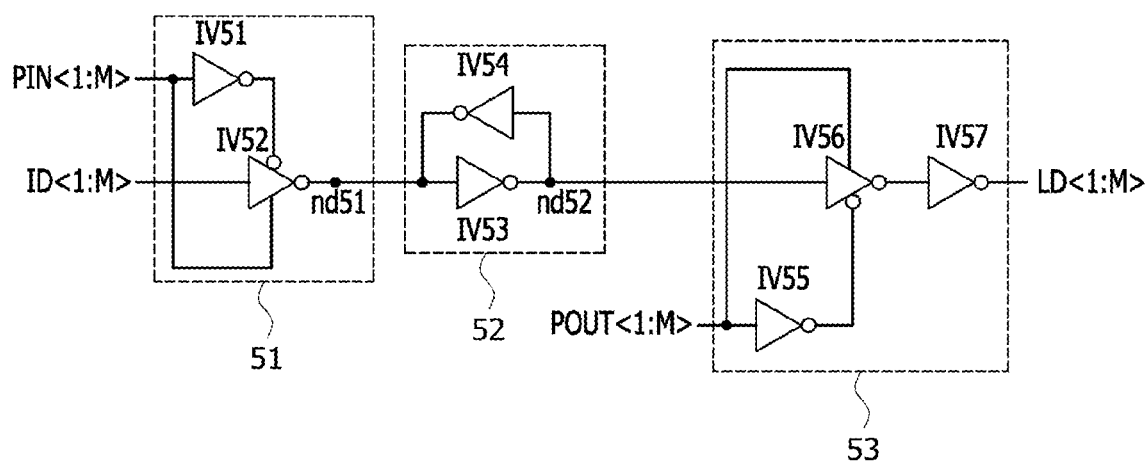
FIG. 6 shows a circuit diagram illustrating a latch data generation circuit included in the semiconductor system of FIG. 1.

Referring to FIG. 6, the latch data generation circuit 118 may include a data input circuit 51, a latch circuit 52, and a data output circuit 53.

The data input circuit 51 may include inverters IV51 and IV52. The inverter IV51 may inversely buffer a pipe input control signal PIN<1:M> to output the inversely buffered signal of the pipe input control signal PIN<1:M>. The inverter IV52 may inversely buffer the internal data ID<1:M> to output the inversely buffered data of the internal data ID<1:M> to a node nd51 if the pipe input control signal PIN<1:M> is generated to have a logic "high" level. Although the data input circuit 51 is illustrated with a single block for the pipe input control signal PIN<1:M> including "M"-number of bits and the internal data ID<1:M> including "M"-number of bits in FIG. 6, the data input circuit 51 may be actually configured to include a plurality of circuits, each of which is illustrated for each bit of the pipe input control signal PIN<1:M> and the internal data ID<1:M>.

The latch circuit 52 may include inverters IV53 and IV54. The inverter IV53 may inversely buffer a signal of the node nd51 to output the inversely buffered signal of the signal of the node nd51 to a node nd52. The inverter IV54 may inversely buffer a signal of the node nd52 to output the inversely buffered signal of the signal of the node nd52 to the node nd51. The latch circuit 52 may latch the signals of the nodes nd51 and nd52.

The data output circuit 53 may include inverters IV55, IV56, and IV57. The inverter IV55 may inversely buffer the pipe output control signal POUT<1:M> to output the inversely buffered signal of the pipe output control signal POUT<1:M>. The inverter IV56 may inversely buffer the signal of the node nd52 to output the inversely buffered signal of the signal of the node nd52 if the pipe output control signal POUT<1:M> is generated to have a logic "high" level. The inverter IV57 may inversely buffer an output signal of the inverter IV56 to output the inversely buffered signal of the output signal of the inverter IV56 as the latch data LD<1:M>.

The latch data generation circuit 118 may latch the internal data ID<1:M> if the pipe input control signal PIN<1:M> is generated to have a logic "high" level. The latch data generation circuit 118 may output the latched data of the internal data ID<1:M> as the latch data LD<1:M> if the pipe output control signal POUT<1:M> is generated to have a logic "high" level.

Figure 7:
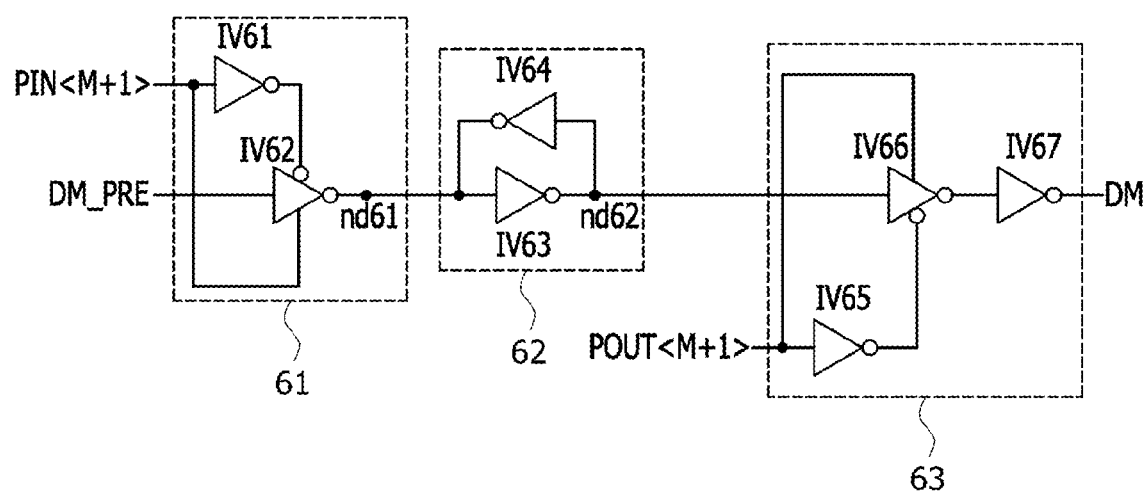
FIG. 7 shows a circuit diagram illustrating a masking signal generation circuit included in the semiconductor system of FIG. 1.

Referring to FIG. 7, the masking signal generation circuit 119 may include a mask input circuit 61, a mask latch circuit 62, and a mask output circuit 63.

The mask input circuit 61 may include inverters IV61 and IV62. The inverter IV61 may inversely buffer the pipe input control signal PIN<M+1> to output the inversely buffered signal of the pipe input control signal PIN<M+1>. The inverter IV62 may inversely buffer the pre-masking signal DM_PRE to output the inversely buffered signal of the pre-masking signal DM_PRE to a node nd61 if the pipe input control signal PIN<M+1> is generated to have a logic "high" level.

The mask latch circuit 62 may include inverters IV63 and IV64. The inverter IV63 may inversely buffer a signal of the node nd61 to output the inversely buffered signal of the signal of the node nd61 to a node nd62. The inverter IV64 may inversely buffer a signal of the node nd62 to output the inversely buffered signal of the signal of the node nd62 to the node nd61. The mask latch circuit 62 may latch the signals of the nodes nd61 and nd62.

The mask output circuit 63 may include inverters IV65, IV66, and IV67. The inverter IV65 may inversely buffer the pipe output control signal POUT<M+1> to output the inversely buffered signal of the pipe output control signal POUT<M+1>. The inverter IV66 may inversely buffer the signal of the node nd62 to output the inversely buffered signal of the signal of the node nd62 if the pipe output control signal POUT<M+1> is generated to have a logic "high" level. The inverter IV67 may inversely buffer an output signal of the inverter IV66 to output the inversely buffered signal of the output signal of the inverter IV66 as the masking signal DM.

The semiconductor system 1 according to the present embodiment may divide the data D<1:M> into two groups and may discriminate whether the number of bits having a logic "low(0)" level in each group is greater than one or less than two to quickly verify execution or non-execution of the data masking operation, when logic levels of the data D<1:M> are detected to perform the data masking operation. In addition, the semiconductor system 1 may be designed such that the data detection circuit 115 detecting the logic levels of the data D<1:M> is located at a pre-stage of the latch data generation circuit 118. As a result, the semiconductor system 1 may detect the logic levels of the data D<1:M> using the data detection circuit 115 while the pipe input control signal PIN<1:M> and the pipe output control signal POUT<1:M> are generated after the write operation, thereby quickly verifying execution or non-execution of the data masking operation even without any additional time.

Figure 8:
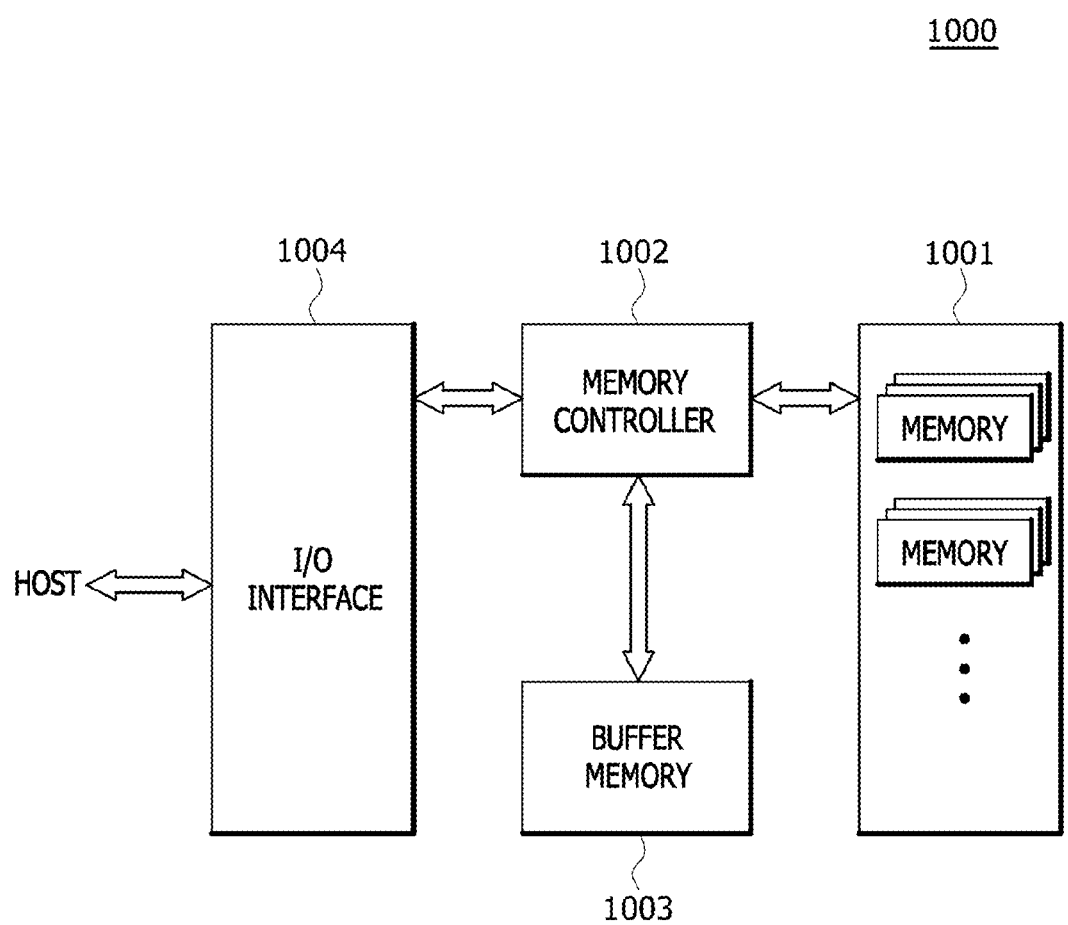
FIG. 8 shows a block diagram illustrating a configuration of an electronic system employing the semiconductor system shown in FIG. 1.

The semiconductor system 1 described with reference to FIG. 1 may be applied to an electronic system that includes a memory system, a graphic system, a computing system, a mobile system, or the like. For example, as illustrated in FIG. 8, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the second semiconductor device 11 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 10 illustrated in FIG. 1. Although FIG. 8 illustrates the memory controller 1002 with a single block, the memory controller 1002 may include one controller for controlling the data storage circuit 1001 and another controller for controlling the buffer memory 1003 including a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a data detection circuit configured to detect a number of bits having a predetermined logic level among bits included in data to generate a detection signal;
   a selection/transmission circuit configured to output the detection signal or a control data signal as a pre-masking signal based on a selection/transmission signal; and
   a masking signal generation circuit configured to latch the pre-masking signal based on a pipe input control signal and configured to output the latched signal of the pre-masking signal as a masking signal for controlling a data masking operation based on a pipe output control signal.

2. The semiconductor device of claim 1, wherein the data detection circuit is configured to generate the detection signal, wherein the detection signal is enabled when one or none of the bits included in the data has the predetermined logic level.

3. The semiconductor device of claim 1, wherein the data detection circuit divides the bits included in the data into at least two groups and generates the detection signal, wherein the detection signal is enabled when a number of the groups including at least one bit having the predetermined logic level is zero or one.

4. The semiconductor device of claim 1,
   wherein the data detection circuit divides the bits included in the data into a first group and a second group, and
   wherein the data detection circuit comprises:
   a first discrimination circuit configured to generate a first up-flag when a number of bits having the predetermined logic level among bits included in the first group of the data is at least two and configured to generate a first down-flag when a number of bits having the predetermined logic level among the bits included in the first group of the data is at least one; and
   a second discrimination circuit configured to generate a second up-flag when a number of bits having the predetermined logic level among bits included in the second group of the data is at least two and configured to generate a second down-flag when a number of bits having the predetermined logic level among the bits included in the second group of the data is at least one.

5. The semiconductor device of claim 4, wherein the data detection circuit further comprises a zero flag generation circuit configured to generate a zero flag, wherein the zero flag is enabled when the first up-flag or the second up-flag is enabled, and wherein the zero flag is enabled when both the first down-flag and the second down-flag are enabled.

6. The semiconductor device of claim 5, wherein the data detection circuit further comprises:
   a synthesis flag generation circuit configured to generate a synthesis flag based on the control data signal and the zero flag; and
   a detection signal generation circuit configured to be synchronized with a write pulse created for a write operation, configured to latch the synthesis flag, and configured to output the latched synthesis flag as the detection signal.

7. The semiconductor device of claim 1, wherein the selection/transmission signal is stored in a mode register of the semiconductor device by a mode register set operation.

8. The semiconductor device of claim 1, wherein the selection/transmission circuit is configured to output the detection signal as the pre-masking signal when the selection/transmission signal has a first logic level and is configured to output the control data signal as the pre-masking signal when the selection/transmission signal has a second logic level.

9. The semiconductor device of claim 1, further comprising a repeater configured to amplify latch data based on the masking signal to generate amplified data, wherein the data are stored in a cell array circuit.

10. The semiconductor device of claim 1, further comprising a data input circuit configured to receive the data based on the control data signal to generate internal data.

11. The semiconductor device of claim 10, wherein the data input circuit is further configured to inversely buffer the data to output the inversely buffered data of the data as the internal data when the control data signal has a first logic level and is further configured to buffer the data to output the buffered data of the data as the internal data when the control data signal has a second logic level.

12. A semiconductor device comprising:
a data detection circuit configured to divide bits included in data into at least two groups, configured to generate a detection signal, wherein the detection signal is enabled when a number of bits having a predetermined logic level among the bits included in the data is zero or one, and wherein the detection signal is enabled when a number of the groups including at least one bit having the predetermined logic level is zero or one; and
a selection/transmission circuit configured to output the detection signal or a control data signal as a pre-masking signal based on a selection/transmission signal.

13. The semiconductor device of claim 12,
wherein the data detection circuit divides the bits included in the data into a first group and a second group, and
wherein the data detection circuit comprises:
a first discrimination circuit configured to generate a first up-flag when a number of bits having the predetermined logic level among bits included in the first group of the data is at least two and configured to generate a first down-flag when a number of bits having the predetermined logic level among the bits included in the first group of the data is at least one; and
a second discrimination circuit configured to generate a second up-flag when a number of bits having the predetermined logic level among the bits included in the second group of the data is at least two and configured to generate a second down-flag when a number of bits having the predetermined logic level among the bits included in the second group of the data is at least one.

14. The semiconductor device of claim 13, wherein the data detection circuit further includes a zero flag generation circuit configured to generate a zero flag, wherein the zero flag is enabled when the first up-flag or the second up-flag is enabled, and wherein the zero flag is enabled when both the first down-flag and the second down-flag are enabled.

15. The semiconductor device of claim 14, wherein the data detection circuit further comprises:
a synthesis flag generation circuit configured to generate a synthesis flag based on the control data signal and the zero flag; and
a detection signal generation circuit configured to be synchronized with a write pulse created for a write operation, configured to latch the synthesis flag, and configured to output the latched synthesis flag as the detection signal.

16. The semiconductor device of claim 12, wherein the selection/transmission circuit is configured to output the detection signal as the pre-masking signal when the selection/transmission signal has a first logic level and is configured to output the control data signal as the pre-masking signal when the selection/transmission signal has a second logic level.

17. The semiconductor device of claim 12, further comprising:
a masking signal generation circuit configured to latch the pre-masking signal based on a pipe input control signal and configured to output the latched signal of the pre-masking signal as a masking signal for controlling a data masking operation based on a pipe output control signal; and
a repeater configured to amplify latch data based on the masking signal to generate amplified data, wherein the data are stored in a cell array circuit.

18. A semiconductor system comprising:
a first semiconductor device configured to output a command, data, and a control data signal; and
a second semiconductor device configured to detect a number of bits having a predetermined logic level among bits included in the data to generate a detection signal when the second semiconductor device performs a write operation based on the command and configured to control a data masking operation and a data bus inversion operation based on the control data signal and the detection signal.

19. The semiconductor system of claim 18, wherein the second semiconductor device comprises a data detection circuit configured to divide the bits included in the data into at least two groups, configured to generate the detection signal, wherein the detection signal is enabled when the number of bits having the predetermined logic level among the bits included in the data is zero or one, and wherein the detection signal is enabled when a number of the groups including at least one bit having the predetermined logic level is zero or one.

20. The semiconductor system of claim 19,
wherein the data detection circuit divides the bits included in the data into a first group and a second group, and
wherein the data detection circuit comprises:
a first discrimination circuit configured to generate a first up-flag when a number of bits having the predetermined logic level among the bits included in a first group of the data is at least two and configured to generate a first down-flag when a number of bits having the predetermined logic level among the bits included in the first group of the data is at least one; and
a second discrimination circuit configured to generate a second up-flag when a number of bits having the predetermined logic level among the bits included in the second group of the data is at least two and configured to generate a second down-flag when a number of bits having the predetermined logic level among the bits included in the second group of the data is at least one.

* * * * *